United States Patent
Easwaran et al.

(10) Patent No.: US 6,816,004 B2
(45) Date of Patent: Nov. 9, 2004

(54) MINIMIZING NOISE IN DATA CHANNELS IMPLEMENTED USING FREQUENCY DIVISION MULTIPLEXING

(75) Inventors: Prakash Easwaran, Bangalore (IN); Naom Chaplik, San Diego, CA (US); Sandeep Oswal, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 12 days.

(21) Appl. No.: 10/259,287

(22) Filed: Sep. 30, 2002

(65) Prior Publication Data

US 2004/0066226 A1 Apr. 8, 2004

(51) Int. Cl.$^7$ .............................................. H03K 5/00
(52) U.S. Cl. .................................................... 327/552
(58) Field of Search ................................ 327/552, 553, 327/554, 555, 556, 557, 558, 559, 311

(56) References Cited

U.S. PATENT DOCUMENTS

| | | | | |
|---|---|---|---|---|
| 4,553,103 A | * | 11/1985 | Rollett | .................... 330/107 |
| 5,617,063 A | * | 4/1997 | Chaplik | ...................... 327/558 |
| 6,201,438 B1 | * | 3/2001 | Nicollini et al. | ............ 327/558 |
| 6,344,773 B1 | * | 2/2002 | Sevastopoulos et al. | .... 327/552 |

\* cited by examiner

*Primary Examiner*—Dinh T. Le
(74) *Attorney, Agent, or Firm*—Wade James Brady, III; Frederick J. Telecky, Jr.

(57) ABSTRACT

A filter circuit with two $2^{nd}$ order stages cascaded in sequence. The first stage is implemented with high quality (Q) factor, and the second stage is implemented with a low Q factor and an imaginary zero. The first stage is designed to further eliminate the unwanted frequency components. The imaginary zero in the second stage eliminates the noise present in the output of the first stage due to the requirement of high Q in the first stage. Any additional noise introduced by the second stage is minimal due to the low Q of the second stage. Each stage may be implemented using only a single operational amplifier when the first stage generates a differential output signal.

84 Claims, 3 Drawing Sheets

MINIMIZING NOISE IN DATA CHANNELS IMPLEMENTED USING FREQUENCY DIVISION MULTIPLEXING

BACKGROUND OF THE INVENTION

1. Field of the Invention

The present invention relates to communication systems, and more specifically to a method and apparatus for minimizing noise when data channels are implemented using on frequency division multiplexing.

2. Related Art

Communication systems are often implemented using frequency division multiplexing (FDM). FDM generally refers to an approach in which different signals are transmitted using different frequency bands on a shared medium. For example, customer premise equipment (CPEs) according ADSL standard use 30 kHz to 138 kHz band to transmit signals ("transmit-signals") containing data ("transmit-information") and 180 kHz to 1160 kHz to receive signals ("receive-signals") containing some other data ("receive-information"). The 30–138 kHz band and 180–1160 kHz band respectively form the transmit channel and receive channel.

Noise is often introduced into receive-signals when generating and transmitting transmit-signals. The noise is generally formed by frequency components generated (while generating and transmitting the transmit-signals) for the receive channel. For example, when converting a digital value (e.g., bit) to a corresponding analog signal, the resulting quantization noise (covering the receive band) forms the noise.

Introduction of such noise into receive-signals is often undesirable. For example, it is generally desirable to generate transmit-signals with a high strength (to enable a distant receiver to receive signals of acceptable strength), and the receive signals are feeble (due to the attenuation caused while propagating from distant source). Due to the need to generate transmit-signals with high strength, the noise generated may also be correspondingly strong. The presence of strong noise components in the receive-signals may present challenges in accurately recovering any information (analog or digital) encoded in the (otherwise feeble) receive-signals.

Accordingly, it may be desirable to eliminate (or substantially reduce) the noise components generated associated with the transmit-signals. Such elimination may need to be performed while meeting several other requirements such as minimizing power consumption.

SUMMARY OF THE INVENTION

A filter circuit provided according to an aspect of the present invention contains a first stage implemented to operate as a second order filter with a high quality (Q) factor (greater than 2), and a second stage also implemented as second order filter but with a low Q factor (lower than 1.5) and an imaginary zero. Due to such a combination of features, unneeded frequency components may be effectively eliminated when implementing, for example, a modem in a DSL environment.

According to another aspect of the present invention, each of the first and second stages may be implemented using only a single operational amplifier, at least in situations when the first stage generates a differential output signal. By minimizing the number of operational amplifiers, the area (in an integrated circuit) and the power consumed may be minimized.

An embodiment of the first stage contains an operational amplifier and a feedback path. The operational amplifier may be coupled to receive an input signal on an inverting input, and generate an output signal. The feedback path couples a fraction of an inverted output signal to the inverting input terminal, thereby providing positive feedback. As the feedback path is coupled to the inverting input terminal, the non-inverting terminal can be used for operating the first stage in a differential mode without requiring additional operational amplifiers.

The first stage may further contain a first resistor and a second resistor coupled in series at a node. The first resistor receives the input signal and the second resistor is connected to the inverting terminal. The feedback path and a first capacitor is connected to the node and the first capacitor is connected between the node and ground. In an embodiment, the feedback path contains a third capacitor. The first stage may further contain a third resistor coupled between the node and the output terminal, and a second capacitor coupled between the output terminal and the inverting input terminal of the operational amplifier.

An embodiment of the second stage contains a second operational amplifier with an output terminal, an inverting input terminal and a non-inverting input terminal. The second stage also contains a first input terminal and a second input terminal and the second input terminal receives an inverted input signal in relation to the first input terminal. A fifth resistor and a fourth capacitor are connected in parallel, which are further connected between the first input terminal and the inverting input terminal of the second operational amplifier.

The second stage further contains a sixth resistor and a seventh resistor connected in series between the output terminal and the inverting input terminal of the second operational amplifier and the sixth resistor and the seventh resistor are connected at a third node. A fifth capacitor is connected between the second input terminal and the third node and a sixth capacitor is connected between the output terminal and the inverting input terminal.

The above configuration enables the first input terminal and the second input terminal to receive inverted signals without requiring additional inverters (or operational amplifiers with a gain of −1). When the first stage generates a differential output signal, the two terminals providing the differential output signal may respectively be connected to the first and second input terminals.

When the first stage generates a single ended output signal, an additional inverter may be used in the first stage to generate the inverted input signal for the feedback path. Accordingly, the output signal and the inverted output signal may be provided to the first and second input terminals respectively. In such a situation, the non-inverting terminal of the operational amplifier in the first stage may be connected to ground. When the second stage generates a single ended output signal, the non-inverting terminal of the operational amplifier in the second stage may also be connected to ground.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the accompanying drawings, wherein.

DETAILED DESCRIPTION OF THE PREFERRED EMBODIMENTS

1. Overview and Discussion of the Invention

An embodiment according to the present invention contains a $4^{th}$ order filter circuit containing two $2^{nd}$ order stages cascaded in sequence. However, the approaches and principles can be used to implement higher order filters, as will be apparent to one skilled in the relevant arts based on the disclosure provided herein. The first stage is implemented with a high quality (Q) factor, and the second stage is implemented with a low Q factor and an imaginary zero.

The high Q factor in the first stage eliminates the unwanted frequency components in addition to ensuring that the allowed components are generated with high amplitude. The imaginary zero in the second stage eliminates the noise present in the output of the first stage due to the requirement of high Q in the first stage. Any additional noise introduced by the second stage is minimal due to the low Q of the second stage.

Another aspect of the present invention enables the first stage to be implemented using only an operational amplifier without using non-inverting input, and yet providing a high Q factor. The positive feedback providing the high Q factor may be attained by feeding back the inverting output to the inverting input of the operational amplifier. As the non-inverting terminal is not used for the positive feedback, the circuit lends to the implementation of differential mode of operation.

One more aspect of the present invention enables the second stage also to be implemented using only a single operational amplifier irrespective of whether the first stage is implemented in single ended mode or differential mode of operation. By minimizing the number of amplifiers, a filter circuit may consume less area and electrical power.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Example System

Figure 1:
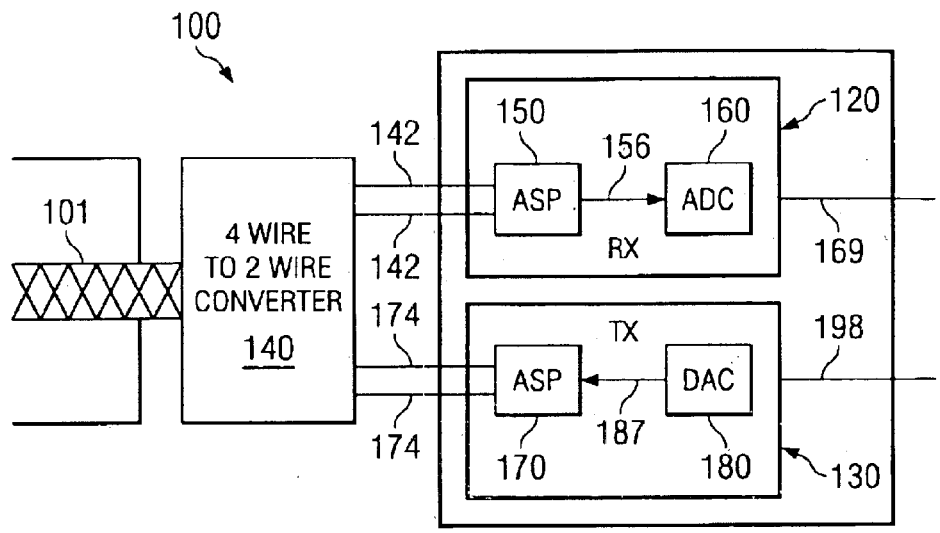
FIG. 1 is a block diagram of a modem illustrating an example system in which the present invention may be implemented.

FIG. 1 is a block diagram of modem 100 illustrating an example system in which the present invention may be implemented. For illustration, it is assumed that modem 100 is implemented to support ADSL standard. However, modem 100 can be implemented with other standards and other environments as well. Modem 100 is shown containing two wire transmission line 101, receiver 120, transmitter 130 and four-wire to two-wire converter 140. Each component is described below.

Two wire transmission line 101 represents a shared medium on which data is transmitted and received. As noted above, it is assumed that data is received and transmitted using ADSL standard. As is well known in the relevant arts, frequency division multiplexing (FDM) approach is used in ADSL to provide a transmit channel in 30–138 kHz band, and a receive channel in the 180–1160 kHz band.

Four wire to two wire converter 140 receives and transmits information through two wire transmission line 101. Four wire to two wire converter 140 generally needs to be designed to receive the receive-signals on two wire path 101 and forward the receive-signals on path 142. Similarly, the transmit-signals received on path 174 need to be forwarded on line 101. Four wire to two wire converter 140 may be implemented in a known way.

Receiver 120 receives analog signals on two wire path 142 and converts the analog signal to digital signal for further processing in later stages. Receiver 120 is shown containing analog signal processor (ASP) 150 and analog to digital converter (ADC) 160. The two components, ASP 150 and ADC 160, are described below.

Analog signal processor 150 may receive on path 142 an analog signal with low strength as the signal may get attenuated while propagating from a distant source. Analog signal processor 150 may first amplify the low signal to a suitable level for further processing. The signal on path 142 may contain different frequency components, but analog signal processor 150 allows only the required frequency components between 180 to 1160 KHz (band forming the receive channel) and rejects all other unwanted components.

Accordingly, analog signal processor 150 may be implemented as an active filter circuit to amplify the low signal as well as to allow only the required frequency components (and rejects all other unwanted components) before sending the signal on path 156 to ADC 160. ADC 160 converts the signal on path 156 to multiple digital samples, and provides the samples on path 169 for further processing.

Transmitter 130 may receive digital signal on path 198 (for example, from a digital processor) and convert the digital signal to analog signal for transmitting through two wire transmission line 101. Transmitter 130 is shown containing analog signal processor (ASP) 170 and digital to analog converter (DAC) 180. The two components, ASP 170 and DAC 180, are described below.

DAC 180 converts the digital data received on path 198 to analog signal. DAC 180 may generate noise while converting digital signal in to analog signal. In general, the generated noise represents quantization noise in the form of white noise spread over the entire frequency range. Thus, the frequency spectrum of the noise may cover the band used to implement the receive channel.

The noise thus generated could be introduced into the frequency band of the receive signal in four wire to two wire converter 140. The introduced components may be strong (high amplitude) since the transmit signal needs to be strong to be received at a distant receiver with a reasonably high strength. The strength of the introduced noise may be particularly problematic in that the receive-signals are generally of low strength ("feeble"), and the noise may form a substantial component of the signal sent to ASP 120. Accordingly, it may be desirable that the noise components (at least covering the frequency spectrum of the receive channel) be eliminated.

Analog signal processor (ASP) 170 performs a filtering operation to eliminate such components as described below. In addition, ASP 170 may also amplify the analog signal for transmitting on two wire transmission line 101. Embodiments of ASP 170 are described below with reference to FIGS. 3A to 3F. The advantages of such embodiments will be apparent by appreciating some prior art embodiment(s). Accordingly, a prior filter circuit used to reduce noise is described below with FIGS. 2A to 2C.

3. Prior Art

Figure 2A:
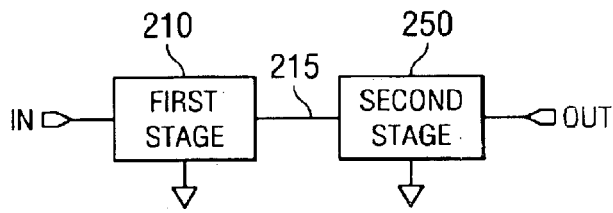
FIG. 2A is a block diagram illustrating the details of an embodiment of prior filter circuit implemented in two stages.
Figure 2B:
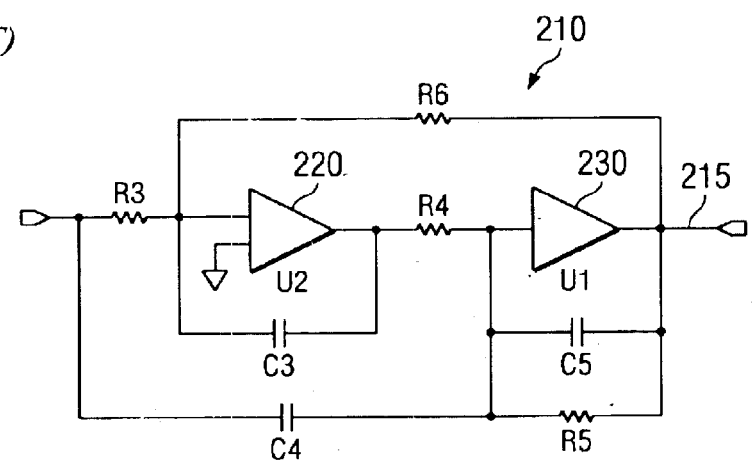
FIG. 2B is a circuit diagram illustrating the details of an embodiment of a prior first filter stage.
Figure 2C:
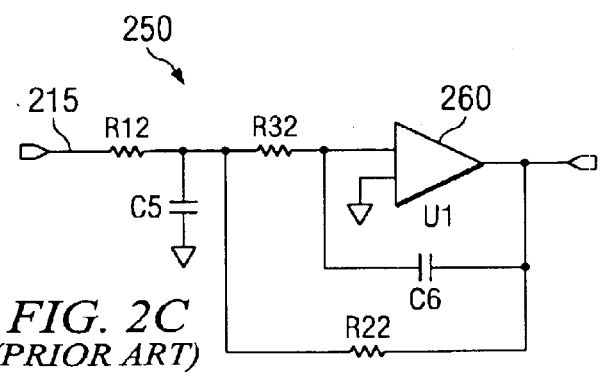
FIG. 2C is a circuit diagram illustrating the details of an embodiment of a prior second filter stage.

FIGS. 2A to 2C are diagrams together illustrating the details of an embodiment of prior filter circuit 200. FIG. 2A is a block diagram illustrating the details of filter circuit 200. Filter circuit 200 operates as a fourth order low pass filter (LPF) and is shown containing first stage 210 and second stage 250, each implementing a second order LPF. The two stages are respectively described below with reference to FIGS. 2B and 2C.

FIG. 2B is a circuit diagram illustrating the details of first stage 210 in an embodiment. First stage 210 is shown implemented as a single ended (one input and one output) circuit and contains two operational amplifiers 220 and 230, resistors (R3, R4, R5 and R6) and capacitors C3, C4 and C5. First stage 210 provides high quality (Q) factor using two operational amplifiers 220 and 230.

Resistors (R3, R4, R5 and R6) and capacitors (C3, C4 and C5) together form a second order low pass filter circuit to allow only the frequency components of transmit channel (between 30–138 KHz) and reject all other frequency components. Thus, first stage 210 may reject the unwanted noise components in transmit signal and provides the filtered analog signal on path 215.

In addition, first stage 210 is implemented to provide imaginary zero which causes sharp cutoff in the frequency response to reject unwanted frequency components. Resistors (R3, R4, R5 and R6) may generate high thermal noise as first stage 210 is implemented to provide high Q. The thermal noise (and other noise components) may be reduced using second LPF stage 250 which is described below with FIG. 2C.

FIG. 2C is a circuit diagram illustrating the details of second stage 250 in one embodiment. Second stage 250 is also shown implemented as a single ended circuit containing operational amplifier 260, resistors R12, R22 and R32 and capacitors C5 and C6. Operational amplifier 260 along with resistors (R12, R22 and R32) and capacitors (C5 and C6) provides low Q and may reduce the noise generated by first stage 210.

As may be appreciated from the above description, first stage 210 contains two operational amplifiers and large capacitors (capacitance value of capacitors is high) to provide high Q. More operational amplifiers and large capacitors generally consume more power and area. Thus, it is desirable to design filter circuit 200 with fewer operational amplifiers and/or with smaller capacitors.

Implementation of first stage 210 using only a single amplifier (i.e., fewer than 2 amplifiers) with differential inputs may present additional challenges. To design first stage 210 with a single operational amplifier to provide high Q, a positive feed back may be needed. A prior circuit may use both the inverting and non-inverting inputs of operational amplifier to achieve the positive feedback. Such an approach may not be suitable for operating with differential inputs/signals as additional input terminals may not be available for the second one of the differential inputs.

In addition, the imaginary zero in first stage 210 may not eliminate the noise generated by the operation of the first stage 210. Even though second stage 220 attenuates such noise, the extent of attenuation close to cut off frequency (of the filter) may not be sufficient to achieve a desired degree of attenuation of the noise components affecting the receive channel. The manner in which ASP 170 may be implemented to address such requirements is described below in further detail.

4. Analog Signal Processor

FIGS. 3A to 3F are diagrams illustrating the details of operation and implementation of analog signal processor (ASP) 170 in an embodiment of the present invention. With respect to FIG. 3A, ASP 170 is shown containing first stage 310 and second stage 320, with each stage implementing a second order low pass filter. However, ASP 170 may also be implemented with higher order filters as described below.

First stage 310 may be implemented with a single operational amplifier to provide high Q factor without imaginary zero. Second stage 320 may be implemented with a single operational amplifier to provide low Q with imaginary zero. In addition, first stage 310 and second stage 320 can individually operate in either single ended mode or differential mode. The manner in which first stage 310 and second stage 320 may be implemented is described below with reference to FIGS. 3B to 3D.

Figure 3A:
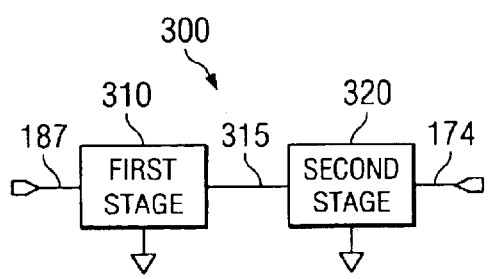
FIG. 3A is a block diagram illustrating the details of an analog signal processor in an embodiment of the present invention.
Figure 3D:
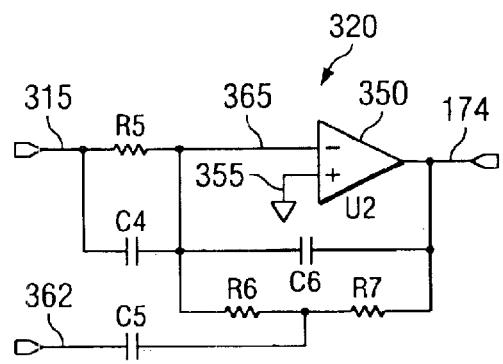
FIG. 3D is a circuit diagram illustrating the details of a second stage in single ended operation in an embodiment of the present invention.
Figure 3B:
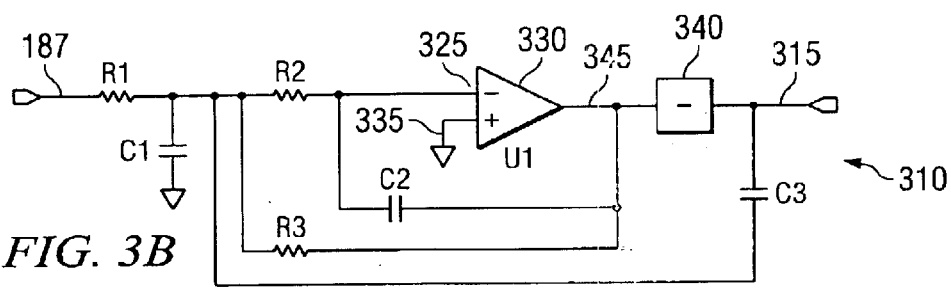
FIG. 3B is a circuit diagram illustrating the details of a first stage in single ended operation in an embodiment of the present invention.

FIG. 3B is a circuit diagram illustrating the details of first stage 310 in an embodiment of the present invention. First stage 310 receives analog signals on path 187 and provides only the frequency components of transmit channel (rejects all other frequency components of receive channel in transmit information) on path 315. First stage 310 is shown containing operational amplifier 330, inverter 340, resistors (R1, R2 and R3) and capacitors (C2 and C3). Each component is described below.

Operational amplifier 330 receives the analog signal (on path 187) at inverting input terminal 325 through the path containing resistors R1 and R2 connected in series, and with capacitor C1 connected between ground and a node connecting R1 and R2. The non-inverting input terminal 335 is connected to ground to provide single ended operation. Operational amplifier 330 amplifies the analog signal at inverting terminal 325 and provides the amplified signal on output terminal 345.

Inverter 340 receives analog signal from output terminal 345 and provides the inverted signal on path 315. In one embodiment, inverter 340 is implemented as an operational amplifier with a gain of −1. The inverted signal on path 315 is fed back to inverting input terminal 325 through capacitor C3 to provide positive feed back, which causes the desired high Q. Due to the presence of impedance in the feedback path, only a portion of the inverted signal on path 315 is coupled to inverting input terminal 325.

Resistors (R1, R2 and R3) and capacitors (C1 and C2), in combination with the feedback path, operate as a second order low pass filter to allow only the frequency components of transmit channel (between 30–138 KHz) and reject (substantially attenuate) all other frequency components of the analog signal received on path 187.

The transfer function of first stage 310 is given by the equation below, in which the term '−C2 R3' in denominator ensures high Q (greater than or equal to 2). The values of various capacitors and resistors may be selected to attain a desired specific value of Q, as is well known in the relevant arts.

Capacitor C5 is shown receiving a signal on path 362. When first stage 310 is implemented in differential mode, path 362 may be connected to the inverting output on path 315' of first stage 310 of FIG. 3C. When first stage 310 is implemented in single ended mode, path 362 may be connected to the inverting output on path 345 of FIG. 3B. By such use of the inverted signals present in the first stage, additional inverter may be avoided in the second stage.

It may be appreciated that the inverting output of first stage 310 in combination with various components of FIG. 3D provides an imaginary zero. The imaginary zero causes substantial attenuation of the frequency (noise) components near to cut off frequency (138 kHz). In addition, noise components overlapping with the band used to implement the receive channel, may also be attenuated.

$$T1\ in(s) = \frac{\frac{-R3}{R1}}{S^2 \cdot (C1+C3) \cdot C2 \cdot R2 \cdot R3 + S \cdot \left[C2\left[R2+R3 \cdot \left(1+\frac{R2}{R1}\right)-C2 \cdot R3\right]\right]+1}$$

In addition, due to such a configuration, it may be observed that non-inverting input terminal 335 is not used to provide the positive feedback. Accordingly, the non-inverting input terminal 335 enables ASP 170 to provide differential mode of operation as described in below paragraphs.

Figure 3C:
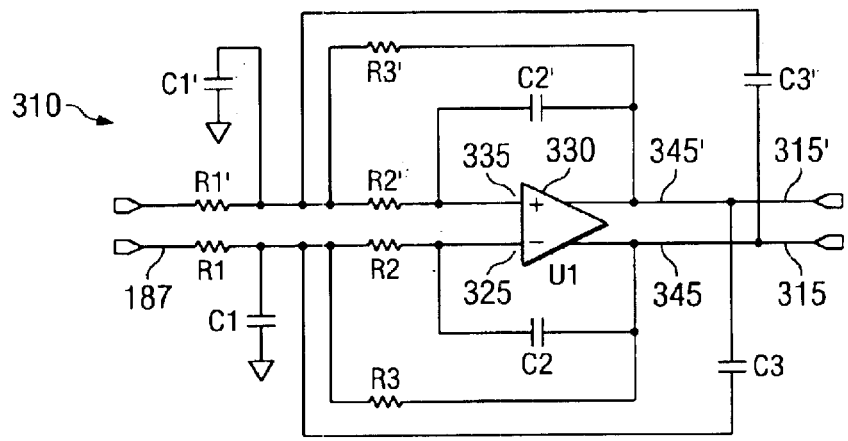
FIG. 3C is a circuit diagram illustrating the details of a first stage in differential mode of operation in an embodiment of the present invention.

FIG. 3C is a block diagram illustrating the details of implementation of the first stage in differential mode of operation in one embodiment of the present invention. As may be appreciated, for differential mode of operation, symmetric configuration may be provided on the side of the non-inverting terminal 335 as well. The components R1', R2', R3', C1', C2', and C3' form the symmetric configuration, and these components respectively operate similar to R1, R2, R3, C1, C2, and C3 (shown in FIG. 3B), as will be apparent to one skilled in the relevant arts.

Capacitors C3' and C3 are respectively shown connected to paths 315 (inverted) and 315' (non-inverted). Since 315 and 315' represent inverted signals of each other, components operating similar to inverter 340 (of FIG. 3B) may not be needed. By using fewer components, area and power consumption requirements may be minimized.

Thus, first stage 310 may be implemented to reject the unwanted noise components in transmit signal and to provide the filtered analog signal on path 315, while minimizing area and power consumption requirements. Resistors (R1, R2 and R3) may generate thermal noise which can be reduced by second stage 320 as described below with FIG. 3D.

FIG. 3D is a circuit diagram illustrating the details of second stage 320 in an embodiment of the present invention. Second stage 320 receives the filtered analog signal on path 315, and rejects the frequency components of (covering the band implementing) the receive channel in the analog (transmit) information. In addition, second stage 320 attenuates the noise generated by first stage 310. Second stage 320 is shown containing operational amplifier 350, resistors (R5, R6 and R7) and capacitors (C4, C5 and C6). The components are described below in further detail.

Operational amplifier 350 receives the filtered analog signal on path 315 at inverting input terminal 365 through the path containing resistor R5 and capacitor C4. The non-inverting input terminal 355 is connected to ground to provide single ended operation. Operational amplifier 350 amplifies the analog signal at inverting input terminal 365.

Resistors (R5, R6 and R7) and capacitors (C4, C5 and C6), along with the other components, perform a second order low pass filter operation to allow only the frequency components of transmit channel to be provided on path 174 and reject noise components generated by first stage 310. As second stage 320 may be implemented to provide low Q, the resistance values of resistors R5, R6 and R7 may be small and thus the noise generated by second stage 320 may be negligible. The principles underlying the operation of an embodiment of second stage 320 are illustrated in below paragraphs with reference to FIGS. 4A through 4C.

Thus, noise generated by first stage 310 and any noise components present in receive channel of the transmit signal (analog information) on path 315 may be reduced by second stage 320 with an imaginary zero. In addition, it may be observed that non-inverting input terminal 355 is not used to provide the imaginary zero. Accordingly, the non-inverting input terminal 355 enables the second stage also to provide differential mode of operation.

Figure 3E:
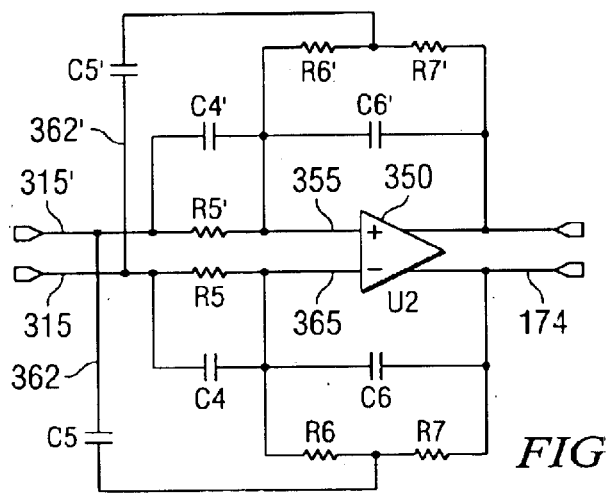
FIG. 3E is a circuit diagram illustrating the details of a second stage in differential mode of operation in an embodiment of the present invention.

As may be appreciated, for differential mode of operation, a symmetric configuration may be provided on the side of the non-inverting terminal 355 as well, as illustrated with reference to FIG. 3E. The components R5', R6', R7', C4', C5', and C6' form the symmetric configuration, and these components respectively operate similar to R5, R6, R7, C4, C5, and C6, as will be apparent to one skilled in the relevant arts. Paths 315 and 315' are respectively shown connected to capacitors C5' and C5 at nodes 362' and 362.

Thus, second stage 320 may be implemented to further reject the unwanted frequency components in transmit signal and also attenuate the noise components generated by first stage 310 in receive channel. Accordingly, the filtered analog signal on path 174 may contain only the components covering the band forming the transmit channel. The frequency response by using the two stages (in ASP 170) is described below with reference to FIG. 3F.

Figure 3F:
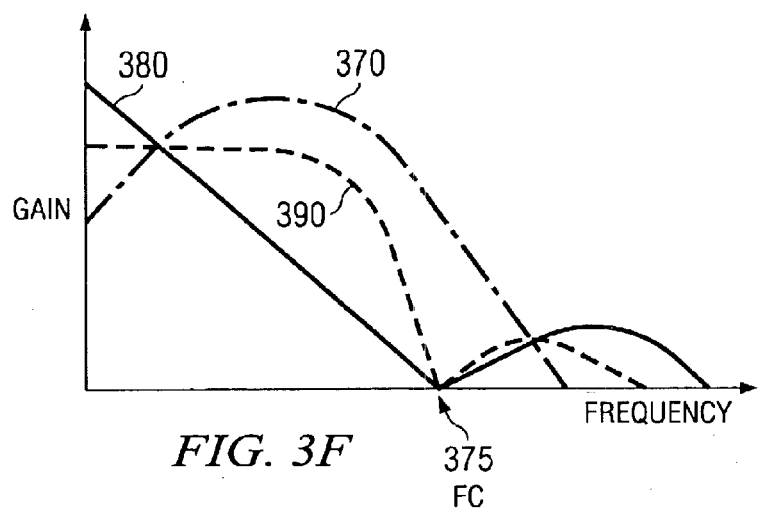
FIG. 3F is a graph illustrating the frequency response of an analog signal processor in an embodiment of the present invention.

FIG. 3F is a graph illustrating the details of frequency response of ASP 170 in an embodiment of the present invention. The frequency fc 375 represents the cut off frequency which separates the transmit channel and the receive channel. The frequency components below fc represents transmit channel and above fc represents receive channel.

The frequency response of ASP 170 depends on frequency responses of first stage 310 and second stage 320. The frequency response of first stage 310 is depicted by curve 370. By examining curve 370, it may be observed that the components of the band in the transmit channel are amplified due to the high Q. In addition, the attenuation provided by first stage 310 is not sufficient to reject all the frequency components above cut off frequency, fc, (i.e., the components in the band forming receive channel) and may need to be attenuated by second stage 320.

The frequency response of second stage 320 is depicted by curve 380. By examining curve 380, it may be readily appreciated that the frequency components near to cut off frequency (fc) are substantially attenuated by second stage 320. The attenuation is caused by the imaginary zero provided by second stage 320. Due to the low Q, the components in the band forming the transmit channel are attenuated to a limited degree.

The frequency response of the two stages 310 and 320, is depicted by curve 390. The components in the band forming the transmit channel (<fc) are shown with a constant amplification factor, and signal is attenuated substantially above the cut-off frequency fc, i.e., in the receive channel (>fc).

Thus, ASP 170 with high Q in first stage 310 and low Q with imaginary zero in second stage 320 may reduce the noise components in transmit signal before sending transmit signal to four wire to two wire converter 140. Each of the two filter stages 310 and 320 may be implemented with a single operational amplifier, low capacitance values (compared to that of filter circuit 200 in prior art) and without using non-inverting terminal.

It can be readily appreciated that the single operational amplifier and low capacitance values generally reduce power and area consumption. In addition, the implementations can be extended to processing of differential signals as the non-inverting input is available for such a purpose. The description is continued with reference to an embodiment of second stage 320.

5. Second Stage

Figure 4A:
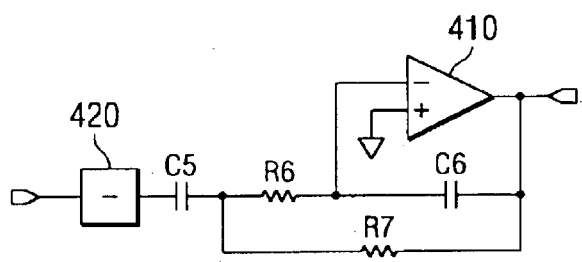
FIGS. 4A to 4C together illustrate the principles underlying the operation and implementation of an embodiment of the second stage.
Figure 4B:
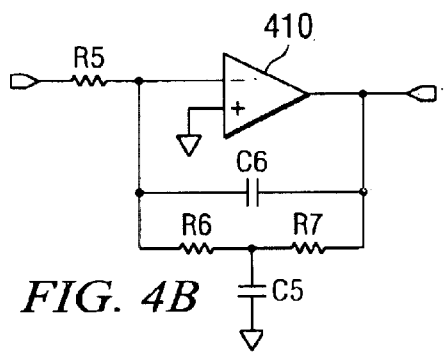
Figure 4C:
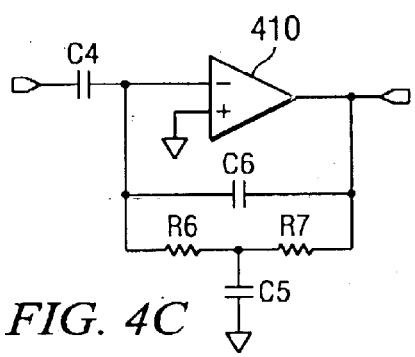

FIGS. 4A through 4C together illustrate the principles underlying the operation and implementation of an embodiment of second stage 320. The components of second stage 320 are introduced in successive stage to provide an understanding of the role of different components in the overall operation.

FIG. 4A is shown containing operational amplifier 410, inverter 420, capacitors C5 and C6, and resistors R6 and R7. It should be understood that inverter 420 logically represents the inverted output received from the previous stage. As may be appreciated, the circuit of FIG. 4A implements a transfer function (TIC5(s)) in s-domain according to equations (1) and (2).

$$TIC5(s) = \frac{s \cdot C5 \cdot R7}{s^2 \cdot C6 \cdot C5 \cdot R6 \cdot R7 + s \cdot C6 \cdot (R6 + R7) + 1} \quad \text{Equation (1)}$$

wherein '.' represents a multiplication operation, '+' represents addition, and C5, C6, R6, R7 represents the impedance (resistance or capacitance) of the respective impedance elements in the above-described diagrams, and 's' represents complex frequency.

$$TIC5(s) = \frac{(B1C5 \cdot s)}{A2I \cdot s^2 + A1I \cdot s + 1} \quad \text{Equation (2)}$$

wherein B1, C5, A2I, A1I represent constants determined by Equation (1).

FIG. 4B is shown containing operational amplifier 410, capacitors C5 and C6, and resistors R5, R6 and R7. As may be appreciated, the circuit of FIG. 4B implements a transfer function (T1R5(s)) as given by equations (3) and (4).

$$TIR5(s) = \left[\frac{-(R6 + R7)}{R5}\right] \cdot \frac{\left(s \cdot C5 \cdot \frac{R5}{R6 + R7} + 1\right)}{s^2 \cdot C5 \cdot C6 \cdot R5 \cdot R6 + s \cdot C6 \cdot (R6 + R7) + 1} \quad \text{Equation (3)}$$

$$TIR5(s) = -Kr5 \cdot \frac{(Br5 \cdot s + 1)}{(A2I \cdot s^2 + A1I \cdot s + 1)} \quad \text{Equation (4)}$$

wherein Br5, A2I and A1I are determined according to Equation (3). It may be noted that A2I and A1I are consistent with Equation (2) as well.

FIG. 4C is shown containing operational amplifier 410, capacitors C4, C5 and C6, and resistors R6 and R7. As may be appreciated, the circuit of FIG. 4C implements a transfer function (T1C4(s)) as given by equations (5) and (6).

$$TIC4(s) = \frac{-[s^2 \cdot C4 \cdot C5 \cdot R6 \cdot R7 + s \cdot [C4 \cdot (R6 + R7)]]}{s^2 \cdot C5 \cdot C6 \cdot R5 \cdot R6 + s \cdot C6 \cdot (R6 + R7) + 1} \quad \text{Equation (5)}$$

$$TIC4(s) = \frac{-(B2c4 \cdot s^2 + B1c4 \cdot s)}{A2I \cdot s^2 + A1I \cdot s + 1} \quad \text{Equation (6)}$$

As may be appreciated that second stage 320 may be achieved by combining FIGS. 4A to 4C. Such a combined circuit diagram is depicted in FIG. 3D. The transfer function of second stage 320 may be obtained by adding the transfer functions of FIGS. 4A, 4B and 4C as given by equation (7) below.

$$TI(s) = TIC5(s) + TIR5(s) + TIC4(s) \quad \text{Equation (7)}$$

Now, Equation (7) can be re-written by replacing transfer functions TIC5(s), TIR5(s) and TIC4(s) respectively with equations (2), (4) and (6) as given by equation (8).

$$TI(s) = -Kr5 \cdot \frac{\left[\left(\frac{-B2c4}{-Kr5}\right) \cdot s^2 + \left[\left(\frac{-B1c4}{-Kr5}\right) + \left(\frac{B1c5}{-Kr5}\right) + Br5\right] \cdot s + 1\right]}{A2I \cdot s^2 + A1I \cdot s + 1}$$

Equation (8)

wherein B1c4, B1c5, Br5 and Kr5 are positive values. The condition to provide imaginary zero is given by equation (9).

$$\left[\left[\left(\frac{B1c4}{Kr5}\right) - \frac{B1c5}{Kr5}\right] + Br5\right] = 0$$

Equation (9)

Therefore, the transfer function of equation (8) is simplified and re-written as given by equation (10).

$$TI(s) = K1 \cdot \frac{(B2I \cdot s^2 + B1I \cdot s + 1)}{A2I \cdot s^2 + A1I \cdot s + 1}$$

Equation (10)

wherein K1, B2I, B1I, A2I and A1I are respectively given by equations (11), (12), (13), (14) and (15). A low Q (less than or equal to 1.5) value may result as A1I does not have a negative term. The specific value of low Q may be attained by appropriate selection of various resistors and capacitors, as is well known in the relevant arts.

$$K1 = \frac{-(R6 + R7)}{R5}$$

Equation (11)

$$B2I = C4 \cdot C5 \cdot \frac{R6 \cdot R7}{R6 + R7}$$

Equation (12)

$$B1I = \left[C4 \cdot R5 + C5 \cdot Re - C5 \cdot \frac{(R7 \cdot R5)}{R6 + R7}\right],$$

Equation (13)

wherein Re=R6*R7/R6+R7.

$$A2I=C5.C6.R6.R7$$

Equation (14)

$$A1I=C6.(R6+R7)$$

Equation (15)

As noted in a book entitled "Active Network Design", by Claude S. Linquist, published by Steward and sons, in 1977, page 586, a stop band second order active RC filter implemented to obtain a Q factor of 1.41425 with the values given below. The book is incorporated in its entirety into the present application herewith.

A2:=2.66667.10$^{-12}$, A1:=1.15467.10$^{-6}$, B2:=5.61798.10$^{-13}$

In an embodiment of the present invention, the value of each component of FIG. 3D is determined as described below. The value of component C6 is given as C6:=27.10$^{-12}$ and the gain of operational amplifier is given as K2:=2. The parameters D1 and D2 are additional parameters, which are computed as illustrated below. The determination each component as a function of other components, A1, A2, B2, D1 and D2 is also illustrated below.

$$D1 := \frac{A2}{A1}; D2 := B2 \cdot \frac{A1}{A2}; R5 := \frac{A1}{C6 \cdot \kappa 2};$$

$$R6 := D1 \cdot \frac{R5}{D1 + D2}; R7 := \left(\frac{A1}{C6}\right) - R6$$

$$C5 := \frac{A2}{R6 \cdot R7 \cdot C6}$$

-continued $$C4 := \frac{D2}{R5}$$

From the values and equations noted above, it can be appreciated that the values of each component of second stage 320 in an embodiment are obtained as given below:

| | | |
|---|---|---|
| R5 = 21382.77778 | R6 = 19345.13025 | R7 = 23420.4253 |
| C4 = 1.13764 × 10$^{-11}$ | C5 = 2.17991 × 10$^{-10}$ | C6 = 2.7 × 10$^{-11}$ |

6. Extension to More Stages

Analog signal processor ASP 170 can be implemented with higher order filters as well. However, as is well known in the relevant arts, higher order filters are less stable than lower order filters. In other words, a second order filter is generally more stable than a direct fourth order filter. Thus, to implement a fourth order filter, two second order filters may be cascaded in series.

Therefore, higher order filters are implemented with multiple second order filters cascaded in series. In environments, for example ADSL, the first one of such multiple stages is implemented as first stage 310. A single instance ("later stage") of second stage 320 may be used in any of the subsequent stages since ADSL transmitter may need only a single imaginary zero. The remaining stages can be implemented as simple second order RC filters, the implementation of which is well known in the relevant arts.

Figure 5:
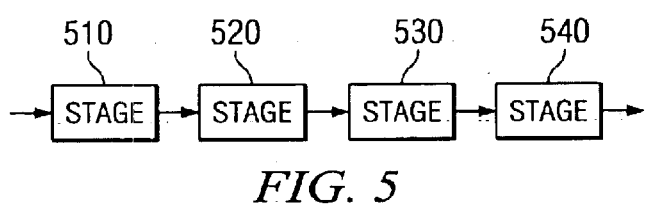
FIG. 5 is a block diagram depicting the manner in which higher order filters can be implemented according to an aspect of the present invention.

Thus, in an embodiment depicted in FIG. 5, stage 510 can be implemented using first stage 310 described above. It may be sufficient to implement second stage 320 in any one of the remaining stages. For example, stage 530 may be implemented using second stage 320. The remaining stages (e.g., 520 and 540) may be implemented as simple active RC filters.

Modem 100 of FIG. 1 can be implemented in several environments. The description is continued with reference to an example environment in which modem 100 may be implemented.

7. Example Environment

Figure 6:
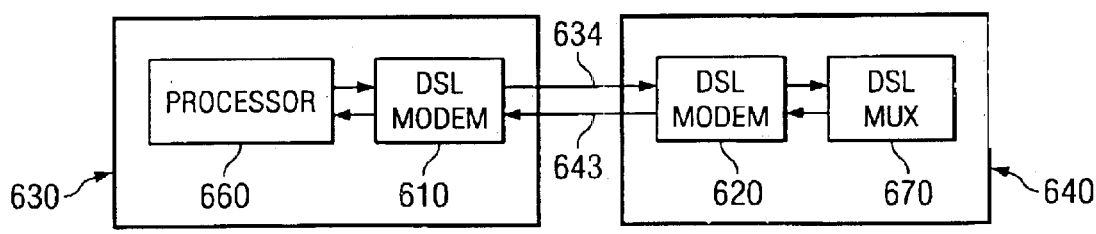
FIG. 6 is a block diagram illustrating the details of an example environment in which the present invention can be implemented.

FIG. 6 is a block diagram illustrating an example environment in which the present invention can be implemented. While the invention is shown implemented in DSL environment, the invention can be implemented in several other mixed signal environments such as WLAN, broadband communication applications.

Example environment 600 is shown containing remote system 630 and DSL Access Multiplexor (DSLAM) 640, which are examples of systems using a modem 100 implemented in accordance with the present invention. Remote systems are typically present in locations such as homes (client premises) which are connected to a central office using telephone wires. DSLAMs are present in the central offices. Each component is described below in further detail.

Remote system 630 is shown containing processor 660 and DSL modem 610. Processor 660 performs various operations to generate the digital data to be transmitted to DSLAM 640. DSL modem 610 transmits digital data by converting digital data into analog signal. Various aspects of the present invention described above may be used to reject unwanted frequency components, and transmit the filtered analog signal over a telephone line.

Similarly, DSL modem 610 converts analog signals received on telephone line (434, 643) into digital format (described above with reference to receiver 120 of FIG. 1) before providing the data to processor 660. The analog data is transmitted to and received from central exchange 640 on paths 634 and 643 (together forming 101 of FIG. 1).

DSLAM 640 is shown containing DSL modem 620 and DSL MUX 670. DSL modem 620 receives analog signals over a telephone line and converts the signals into digital format. DSL MUX 670 receives and transmits digital data to various others systems (potentially using routers and/or switches, not shown) that are connected to central exchange 640. DSL modems 610 and 620 may correspond to modem 100 of FIG. 1.

In an embodiment, DSL modem 610 is implemented according to asymmetric digital subscriber's loop (ADSL) technology. As is well known in the relevant arts, ADSL technologies enable the user to receive data at a faster rate (downstream rate) compared to the upstream rate. A high signal to noise ratio is desired when data is received at a fast rate. Thus, the present invention is particularly useful in implementing modem 610 in ADSL environment.

Thus, the embodiments described above can be used to improve reception of receive signals while rejecting all other noise generated in receive channel in DSL modems. The present invention enables a modem to provide a high signal to noise ratio by reducing the noise components.

8. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A filter processing an input signal, said filter comprising:
   a first stage receiving said input signal, said first stage implementing a second order filter operation, said first stage being implemented to filter said input signal with a high quality (Q) factor and to generate an output signal; and
   a second stage coupled to receive said output signal generated by said first stage, said second stage also implementing a second order filter operation, said second stage being implemented to filter said output signal with a low Q factor and an imaginary zero.

2. The filter of claim 1, wherein said second stage contains only a single operational amplifier.

3. The filter of claim 2, wherein said output signal comprises a differential output and said first stage also contains only a single operational amplifier.

4. The filter of claim 1, wherein said first stage comprises:
   an operational amplifier containing an output terminal, an inverting input terminal and a non-inverting input terminal; and
   a feedback path coupling a fraction of an inverted output signal to said inverting input terminal, wherein said inverted output signal has an inverted relationship with said output signal.

5. The filter of claim 4, wherein said feedback path comprises a third capacitor.

6. The filter of claim 5, wherein said first stage further comprises a first resistor and a second resistor coupled in series at a node, wherein said first resistor is connected to receive said input signal and said second resistor is connected to said inverting terminal, wherein said feedback path and a second capacitor are connected to said node, wherein said second capacitor is connected between said node and ground.

7. The filter of claim 6, wherein said first stage further comprises a third resistor coupled between said node and said output terminal of said operational amplifier of said first stage.

8. The filter of claim 7, wherein said first stage further comprises a second capacitor coupled between said output terminal and said inverting input terminal of said operational amplifier of said first stage.

9. The filter of claim 8, wherein said second stage comprises:
   a second operational amplifier containing an output terminal, an inverting input terminal and a non-inverting input terminal;
   a first input terminal and a second input terminal, wherein said second input terminal receives an inverted input signal in relation to said first input terminal;
   a fifth resistor connecting said first input terminal to said inverting input terminal of said second operational amplifier;
   a fourth capacitor connected in parallel to said fifth resistor;
   a sixth resistor and a seventh resistor connected in series between said output terminal and said inverting input terminal of said second operational amplifier, said sixth resistor and said seventh resistor being connected at a third node;
   a fifth capacitor connecting said second input terminal to said third node; and
   a sixth capacitor connected between said output terminal and said inverting input terminal.

10. The filter of claim 9, wherein said output signal comprises a differential signal provided on two terminals, wherein said first input terminal and said second input terminal are respectively connected to said two terminals providing said differential signal.

11. The filter of claim 10, wherein one of said two terminals transmits said output signal, and wherein said feedback path is coupled to receive said inverted output signal present on the other one of said two terminals.

12. The filter of claim 11, wherein said second operational amplifier generates a differential output.

13. The filter of claim 11, wherein said second operational amplifier generates a single ended output.

14. The filter of claim 13, wherein said non-inverting input terminal of said second operational amplifier is coupled to a ground.

15. The filter of claim 7, wherein said output signal comprises a single ended signal, and wherein said non-inverting terminal of said operational amplifier is connected to a ground.

16. The filter of claim 15, wherein said feedback path comprises an inverter to invert said output signal and generate said inverted output signal.

17. The filter of claim 2, wherein said second stage comprises:
   a fifth capacitor and a fifth resistor connected in serial at a second node;
   a sixth capacitor coupled between said output terminal and said inverting input terminal; and
   a seventh resistor connected between said output terminal and said second node.

18. The filter of claim 2, wherein said second stage comprises:
- a fifth resistor connected to receive said output signal generated by said first stage, said fifth resistor being connected to said inverting input terminal;
- a sixth resistor and a seventh resistor connected in series between said output terminal and said inverting input terminal, said sixth resistor and said seventh resistor being connected at a third node;
- a fifth capacitor connected between said third node and a ground; and
- a sixth capacitor connected between said output terminal and said inverting input terminal.

19. The filter of claim 2, wherein said second stage comprises:
- a fourth capacitor connected to receive said output signal generated by said first stage, said fourth capacitor being connected to said inverting input terminal;
- a sixth resistor and a seventh resistor connected in series between said output terminal and said inverting input terminal, said sixth resistor and said seventh resistor being connected at a third node;
- a fifth capacitor connected between said third node and a ground; and
- a sixth capacitor connected between said output terminal and said inverting input terminal.

20. The filter of claim 2, wherein said high Q equals a value of greater than or equal to 2 and said low Q equals a value of less than or equal to 1.5.

21. A later stage of a filter, said second stage comprising:
- an operational amplifier containing an output terminal, an inverting input terminal and a non-inverting input terminal;
- a first input terminal and a second input terminal, wherein said second input terminal receives an inverted input signal in relation to said first input terminal;
- a fifth resistor connecting said first input terminal to said inverting input terminal of said operational amplifier;
- a fourth capacitor connected in parallel to said fifth resistor;
- a sixth resistor and a seventh resistor connected in series between said output terminal and said inverting input terminal of said operational amplifier, said sixth resistor and said seventh resistor being connected at a third node;
- a fifth capacitor connecting said second input terminal to said third node; and
- a sixth capacitor connected between said output terminal and said inverting input terminal.

22. The stage of claim 21, wherein an output signal generated by a previous stage comprises a differential signal provided on two terminals, wherein said first input terminal and second input terminal are respectively connected to said two terminals providing said differential signal.

23. The second stage of claim 21, wherein an output signal generated by a previous stage comprises a single ended signal, wherein said single ended signal is provided on said first input terminal and said non-inverting input terminal is coupled to a ground.

24. A first stage of a filter circuit, said first stage comprising:
- an operational amplifier containing an output terminal, an inverting input terminal and a non-inverting input terminal, said operational amplifier generating an output signal on said output terminal in response to receiving an input signal; and
- a feedback path coupling a fraction of an inverted output signal to said inverting input terminal, wherein said inverted output signal has an inverted relationship with said output signal;
- wherein said feedback path comprises a first capacitor;
- further comprising a first resistor and a second resistor coupled in series at a node, wherein said first resistor is connected to receive said input signal and said second resistor is connected to said inverting terminal, wherein said feedback path and a second capacitor are connected to said node, wherein said second capacitor is connected between said node and ground.

25. The first stage of claim 24, further comprises a third resistor coupled between said node and said output terminal of said operational amplifier of said first stage.

26. The first stage of claim 25, further comprises a third capacitor coupled between said output terminal and said inverting input terminal of said operational amplifier of said first stage.

27. A modem comprising:
- a digital to analog converter (DAC) converting a digital data to an input signal;
- a first stage receiving said input signal, said first stage implementing a second order filter operation, said first stage being implemented to filter said input signal with a high quality (Q) factor and to generate an output signal; and
- a second stage coupled to receive said output signal generated by said first stage, said second stage also implementing a second order filter operation, said second stage being implemented to filter said output signal with a low Q factor and an imaginary zero.

28. The modem of claim 27, wherein said second stage contains only a single operational amplifier.

29. The modem of claim 28, wherein said output signal comprises a differential output and said first stage also contains only a single operational amplifier.

30. The modem of claim 27, wherein said first stage comprises:
- an operational amplifier containing an output terminal, an inverting input terminal and a non-inverting input terminal; and
- a feedback path coupling a fraction of an inverted output signal to said inverting input terminal, wherein said inverted output signal has an inverted relationship with said output signal.

31. The modem of claim 30, wherein said feedback path comprises a third capacitor.

32. The modem of claim 31, wherein said first stage further comprises a first resistor and a second resistor coupled in series at a node, wherein said first resistor is connected to receive said input signal and said second resistor is connected to said inverting terminal, wherein said feedback path and a second capacitor is connected to said node, wherein said second capacitor is connected between said node and ground.

33. The modem of claim 32, wherein said first stage further comprises a third resistor coupled between said node and said output terminal of said operational amplifier of said first stage.

34. The modem of claim 33, wherein said first stage further comprises a second capacitor coupled between said output terminal and said inverting input terminal of said operational amplifier of said first stage.

35. The modem of claim 34, wherein said first stage implements a transfer function of:

$$Tlin(s) = \frac{\frac{-R3}{R1}}{S^2 \cdot (C1+C3) \cdot C2 \cdot R2 \cdot R3 + S \cdot \left[C2\left[R2+R3 \cdot \left(1+\frac{R2}{R1}\right)-C2 \cdot R3\right]\right]+1}$$

wherein R1, R2, R3, C1, C2, and C3 respectively represent said first resistor, said second resistor, said third resistor, said first capacitor, said second capacitor, and said third capacitor, and wherein S represents an S domain, '.' represents multiplication, and '+' represents addition.

36. The modem of claim 34, wherein said second stage comprises:
- a second operational amplifier containing an output terminal, an inverting input terminal and a non-inverting input terminal;
- a first input terminal and a second input terminal, wherein said second input terminal receives an inverted input signal in relation to said first input terminal;
- a fifth resistor connecting said first input terminal to said inverting input terminal of said second operational amplifier;
- a fourth capacitor connected in parallel to said fifth resistor;
- a sixth resistor and a seventh resistor connected in series between said output terminal and said inverting input terminal of said second operational amplifier, said sixth resistor and said seventh resistor being connected at a third node;
- a fifth capacitor connecting said second input terminal to said third node; and
- a sixth capacitor connected between said output terminal and said inverting input terminal.

37. The modem of claim 34, wherein said output signal comprises a differential signal provided on two terminals, wherein said first input terminal and said second input terminal are respectively connected to said two terminals providing said differential signal.

38. The modem of claim 37, wherein one of said two terminals transmits said output signal, and wherein said feedback path is coupled to receive said inverted output signal present on the other one of said two terminals.

39. The modem of claim 38, wherein said second operational amplifier generates a differential output.

40. The modem of claim 38, wherein said second operational amplifier generates a single ended output.

41. The modem of claim 40, wherein said non-inverting input terminal of said second operational amplifier is coupled to a ground.

42. The modem of claim 33, wherein said output signal comprises a single ended signal, and wherein said non-inverting terminal of said operational amplifier is connected to a ground.

43. The modem of claim 42, wherein said feedback path comprises an inverter to invert said output signal and generate said inverted output signal.

44. The modem of claim 28, wherein said second stage comprises:
- a fifth capacitor and a fifth resistor connected in serial at a second node;
- a sixth capacitor coupled between said output terminal and said inverting input terminal; and
- a seventh resistor connected between said output terminal and said second node.

45. The modem of claim 28, wherein said second stage comprises:
- a fifth resistor connected to receive said output signal generated by said first stage, said fifth resistor being connected to said inverting input terminal;
- a sixth resistor and a seventh resistor connected in series between said output terminal and said inverting input terminal, said sixth resistor and said seventh resistor being connected at a third node;
- a fifth capacitor connected between said third node and a ground; and
- a sixth capacitor connected between said output terminal and said inverting input terminal.

46. The modem of claim 28, wherein said second stage comprises:
- a fourth capacitor connected to receive said output signal generated by said first stage, said fourth capacitor being connected to said inverting input terminal;
- a sixth resistor and a seventh resistor connected in series between said output terminal and said inverting input terminal, said sixth resistor and said seventh resistor being connected at a third node;
- a fifth capacitor connected between said third node and a ground; and
- a sixth capacitor connected between said output terminal and said inverting input terminal.

47. The modem of claim 28, further comprising a plurality of stages in addition to said first stage and said second stage.

48. The modem of claim 28, wherein said high Q comprises a number greater than or equal to 2, and said low Q comprises a number less than or equal to 1.50.

49. The invention of claim 28, wherein said modem comprises a DSL modem.

50. A modem comprising:
- a digital to analog converter (DAC) converting a digital data to an input signal;
- a first stage receiving said input signal and generating a differential signal on a inverting output and a non-inverting output, said first stage implementing a second order filter operation; and
- a second stage coupled to process said differential signal, said second stage comprising:
  - an operational amplifier containing an output terminal, an inverting input terminal and a non-inverting input terminal;
  - a first input terminal and a second input terminal, wherein said first output terminal receives said inverted output and said second input terminal receives said non-inverted output;
  - a fifth resistor connecting said first input terminal to said inverting input terminal of said operational amplifier;
  - a fourth capacitor connected in parallel to said fifth resistor;
  - a sixth resistor and a seventh resistor connected in series between said output terminal and said inverting input terminal of said operational amplifier, said sixth resistor and said seventh resistor being connected at a third node;
  - a fifth capacitor connecting said second input terminal to said third node; and
  - a sixth capacitor connected between said output terminal and said inverting input terminal.

51. The invention of claim 50, wherein said modem comprises a DSL modem.

52. A modem comprising:
- a digital to analog converter (DAC) converting a digital data to an input signal; and a first stage of a filter circuit, said first stage comprising:
an operational amplifier containing an output terminal, an inverting input terminal and a non-inverting input terminal, said operational amplifier generating an output signal on said output terminal in response to receiving said input signal; and
a feedback path coupling a fraction of an inverted output signal to said inverting input terminal, wherein said inverted output signal has an inverted relationship with said output signal;
wherein said feedback path comprises a first capacitor; and
wherein said first stage further comprises a first resistor and a second resistor coupled in series at a node, wherein said first resistor is connected to receive said input signal and said second resistor is connected to said inverting terminal, wherein said feedback path and a second capacitor are connected to said node, wherein said second capacitor in connected between said node and ground.

53. The modem of claim 52, wherein said first stage further comprises a third capacitor coupled between said node and said output terminal of said operational amplifier of said first stage.

54. The modem of claim 53, wherein said first stage further comprises a third capacitor coupled between said output terminal and said inverting input terminal of said operational amplifier of said first stage.

55. The modem of claim 54, wherein said first stage implements a transfer function of:

$$T1in(s) = \frac{\frac{-R3}{R1}}{S^2(C1+C3)\cdot C2 \cdot R2 \cdot R3 + S\cdot\left[C2\left[R2+R3\cdot\left(1+\frac{R2}{R1}\right) - C2\cdot R3\right]\right] + 1}$$

wherein R1, R2, R3, C1, C2, and C3 respectively represent said first resistor, said second resistor, said third resistor, said first capacitor, said second capacitor, and said third capacitor, and wherein S represents an S domain, '.' represents multiplication, and '+' represents addition.

56. A system comprising:
a processor generating a digital data;
a digital to analog converter (DAC) converting said digital data to an input signal;
a first stage receiving said input signal, said first stage implementing a second order filter operation, said first stage being implemented to filter said input signal with a high quality (Q) factor and to generate an output signal; and
a second stage coupled to receive said output signal generated by said first stage, said second stage also implementing a second order filter operation, said second stage being implemented to filter said output signal with a low Q factor and an imaginary zero.

57. The system of claim 56, wherein said second stage contains only a single operational amplifier.

58. The system of claim 57, wherein said output signal comprises a differential output and said first stage also contains only a single operational amplifier.

59. The system of claim 56, wherein said first stage comprises:
an operational amplifier containing an output terminal, an inverting input terminal and a non-inverting input terminal; and
a feedback path coupling a fraction of an inverted output signal to said inverting input terminal, wherein said inverted output signal has an inverted relationship with said output signal.

60. The system of claim 59, wherein said feedback path comprises a third capacitor.

61. The system of claim 60, wherein said first stage further comprises a first resistor and a second resistor coupled in series at a node, wherein said first resistor is connected to receive said input signal and said second resistor is connected to said inverting terminal, wherein said feedback path and a second capacitor is connected to said node, wherein said second capacitor is connected between said node and ground.

62. The system of claim 61, wherein said first stage further comprises a third resistor coupled between said node and said output terminal of said operational amplifier of said first stage.

63. The system of claim 62, wherein said first stage further comprises a second capacitor coupled between output terminal and said inverting input terminal of said operational amplifier of said first stage.

64. The system of claim 63, wherein said first stage implements a transfer function of:

$$T1in(s) = \frac{\frac{-R3}{R1}}{S^2 \cdot (C1+C3)\cdot C2 \cdot R2 \cdot R3 + S\cdot\left[C2\left[R2+R3\cdot\left(1+\frac{R2}{R1}\right) - C2\cdot R3\right]\right] + 1}$$

wherein R1, R2, R3, C1, C2, and C3 respectively represent said first resistor, said second resistor, said third resistor, said first capacitor, said second capacitor, and said third capacitor, and wherein S represents an S domain, '.' represents multiplication, and '+' represents addition.

65. The system of claim 63, wherein said second stage comprises:
a second operational amplifier containing an output terminal, an inverting input terminal and a non-inverting input terminal;
a first input terminal and a second input terminal, wherein said second input terminal receives an inverted input signal in relation to said first input terminal;
a fifth resistor connecting said first input terminal to said inverting input terminal of said second operational amplifier;
a fourth capacitor connected in parallel to said fifth resistor;
a sixth resistor and a seventh resistor connected in series between said output terminal and said inverting input terminal of said second operational amplifier, said sixth resistor and said seventh resistor being connected at a third node;
a fifth capacitor connecting said second input terminal to said third node; and
a sixth capacitor connected between said output terminal and said inverting input terminal.

66. The system of claim 63, wherein said output signal comprises a differential signal provided on two terminals, wherein said first input terminal and said second input terminal are respectively connected to said two terminals providing said differential signal.

67. The system of claim 66, wherein one of said two terminals transmits said output signal, and wherein said feedback path is coupled to receive said inverted output signal present on the other one of said two terminals.

68. The system of claim 67, wherein said second operational amplifier generates a differential output.

69. The system of claim 67, wherein said second operational amplifier generates a single ended output.

70. The system of claim 69, wherein said non-inverting input terminal of said second operational amplifier is coupled to a ground.

71. The system of claim 62, wherein said output signal comprises a single ended signal, and wherein said non-inverting terminal of said operational amplifier is connected to a ground.

72. The system of claim 61, wherein said feedback path comprises an inverter to invert said output signal and generate said inverted output signal.

73. The system of claim 57, wherein said second stage comprises:
a fifth capacitor and a fifth resistor connected in serial at a second node;
a sixth capacitor coupled between said output terminal and said inverting input terminal; and
a seventh resistor connected between said output terminal and said second node.

74. The system of claim 57, wherein said second stage comprises:
a fifth resistor connected to receive said output signal generated by said first stage, said fifth resistor being connected to said inverting input terminal;
a sixth resistor and a seventh resistor connected in series between said output terminal and said inverting input terminal, said sixth resistor and said seventh resistor being connected at a third node;
a fifth capacitor connected between said third node and a ground; and
a sixth capacitor connected between said output terminal and said inverting input terminal.

75. The system of claim 57, wherein said second stage comprises:
a fourth capacitor connected to receive said output signal generated by said first stage, said fourth capacitor being connected to said inverting input terminal;
a sixth resistor and a seventh resistor connected in series between said output terminal and said inverting input terminal, said sixth resistor and said seventh resistor being connected at a third node;
a fifth capacitor connected between said third node and a ground; and
a sixth capacitor connected between said output terminal and said inverting input terminal.

76. The system of claim 57, further comprising a plurality of stages in addition to said first stage and said second stage.

77. The system of claim 57, wherein said high Q comprises a number greater than or equal to 2, and said low Q comprises a number less than or equal to 1.50.

78. The system of claim 57, wherein said modem comprises a DSL modem.

79. A system comprising:
a processor generating a digital data;
a digital to analog converter (DAC) converting said digital data to an input signal;
a first stage receiving said input signal and generating a differential signal on a inverting output and a non-inverting output, said first stage implementing a second order filter operation; and
a second stage coupled to process said differential signal, said second stage comprising:
an operational amplifier containing an output terminal, an inverting input terminal and a non-inverting input terminal;
a first input terminal and a second input terminal, wherein said first output terminal receives said inverted output and said second input terminal receives said non-inverted output;
a fifth resistor connecting said first input terminal to said inverting input terminal of said operational amplifier;
a fourth capacitor connected in parallel to said fifth resistor;
a sixth resistor and a seventh resistor connected in series between said output terminal and said inverting input terminal of said operational amplifier, said sixth resistor and said seventh resistor being connected at a third node;
a fifth capacitor connecting said second input terminal to said third node; and
a sixth capacitor connected between said output terminal and said inverting input terminal.

80. The system of claim 79, wherein said first stage and said second stage are comprised in a DSL modem.

81. A system comprising:
a processor generating a digital data;
a digital to analog converter (DAC) converting said digital data to an input signal; and
a first stage of a filter circuit, said first stage comprising:
an operational amplifier containing an output terminal, an inverting input terminal and a non-inverting input terminal, said operational amplifier generating an output signal on said output terminal in response to receiving said input signal; and
a feedback path coupling a fraction of an inverted output signal to said inverting input terminal, wherein said inverted output signal has an inverted relationship with said output signal,
wherein said feedback path comprises a first capacitor,
wherein said first stage further comprises a first resistor and a second resistor coupled in series at a node, wherein said first resistor is connected to receive said input signal and said second resistor is connected to said inverting terminal, wherein said feedback path and a second capacitor are connected to said node, wherein said second capacitor is connected between said node and ground.

82. The system of claim 81, wherein said first stage further comprises a third resistor coupled between said node and said output terminal of said operational amplifier of said first stage.

83. The system of claim 82, wherein said first stage further comprises a second capacitor coupled between said output terminal and said inverting input terminal of said operational amplifier of said first stage.

84. The system of claim 83, wherein said first stage implements a transfer function of:

$$T1in(s) = \frac{\frac{-R3}{R1}}{S^2 \cdot (C1+C3) \cdot C2 \cdot R2 \cdot R3 + S \cdot \left[C2\left[R2+R3 \cdot \left(1+\frac{R2}{R1}\right)\right] - C2 \cdot R3\right] + 1}$$

wherein R1, R2, R3, C1, C2, and C3 respectively represent said first resistor, said second resistor, said third resistor, said first capacitor, said second capacitor, and said third capacitor, and wherein S represents an S domain, '.' represents multiplication, and '+' represents addition.

* * * * *